United States Patent [19]
Dahl et al.

[11] 4,388,584
[45] Jun. 14, 1983

[54] BATTERY MONITORING AND CHARGER CONTROL SYSTEM

[76] Inventors: Ernest A. Dahl, 3247 Breaker Dr., Ventura, Calif. 93003; George H. Barry, 21225 Saratoga Hills Rd., Saratoga, Calif. 95070

[21] Appl. No.: 314,319

[22] Filed: Oct. 23, 1981

[51] Int. Cl.³ .............................................. H02J 7/04
[52] U.S. Cl. ...................................... 320/48; 320/39; 340/636
[58] Field of Search ....................... 320/31, 32, 33, 35, 320/36, 39, 40, 43, 47, 48; 340/636

[56] References Cited
U.S. PATENT DOCUMENTS

| | | | |
|---|---|---|---|
| 2,534,633 | 12/1950 | Smith | 340/636 |
| 3,600,234 | 8/1971 | Massie | 340/636 |
| 3,872,457 | 3/1975 | Ray et al. | 340/636 |
| 3,994,175 | 11/1976 | Yamaguchi et al. | 340/619 |
| 4,247,811 | 1/1981 | Findl | 320/35 |
| 4,308,492 | 12/1981 | Mori et al. | 320/39 |

FOREIGN PATENT DOCUMENTS 2742675  4/1979  Fed. Rep. of Germany ........ 320/48

Primary Examiner—William M. Shoop
Assistant Examiner—Anita M. Ault
Attorney, Agent, or Firm—Robert F. Beers; Joseph M. St.Amand

[57] ABSTRACT

A battery cell controlled charging system, consisting of a display unit, battery cell probes, a battery charger and circuitry for controlling the charger, monitors the specific gravity, electrolyte level and temperature control of each cell in a multi-cell lead-acid battery and uses the information to automatically charge the battery when a cell or cells become out of specification while restricting overcharging which is damaging to cells.

6 Claims, 4 Drawing Figures

BATTERY MONITORING AND CHARGER CONTROL SYSTEM

BACKGROUND OF THE INVENTION

This invention relates to battery condition monitoring and controlling of a battery charger for automatically charging battery cells as needed.

There are a number of prior art devices which operate in various manners to detect the specific gravity and/or electrolyte level of a battery. Normally when one of these devices indicate that a battery charge is low an operator can remove the battery for charging. However, none of the prior art devices use battery cell probe caps which probe each cell of a battery; indicate to the operator the state of charge (specific gravity) of the least fully-charged cell in battery; warn the operator of abnormally low electrolyte level or high temperature in any cell, and, automatically control a charging system.

SUMMARY OF THE INVENTION

The invention is a system which monitors the condition of a multiple-cell lead-acid battery, and consists of a display unit and probes in the caps of individual battery cells and circuitry for controlling a battery charger. The system employs a novel and simple telemetry system which supplies power to all the cell probes and returns the specific gravity information, level, and temperature alarms on a single, common pair of wires. This invention automatically scans all the cells in a battery system and provides automatic telemetering to a readout to provide data on all cells, but provides readout on the worst cell. This information, in turn, is used to control the battery charger The invention is a cell controlled charging system which permits, by constant cell monitoring, automatic battery charging when out of specification, and provides control to reduce damage to cells. The system circuitry restricts overcharing which is damaging to the cells, thereby providing longer cell life.

DESCRIPTION OF THE PREFERRED EMBODIMENT

Figure 1:
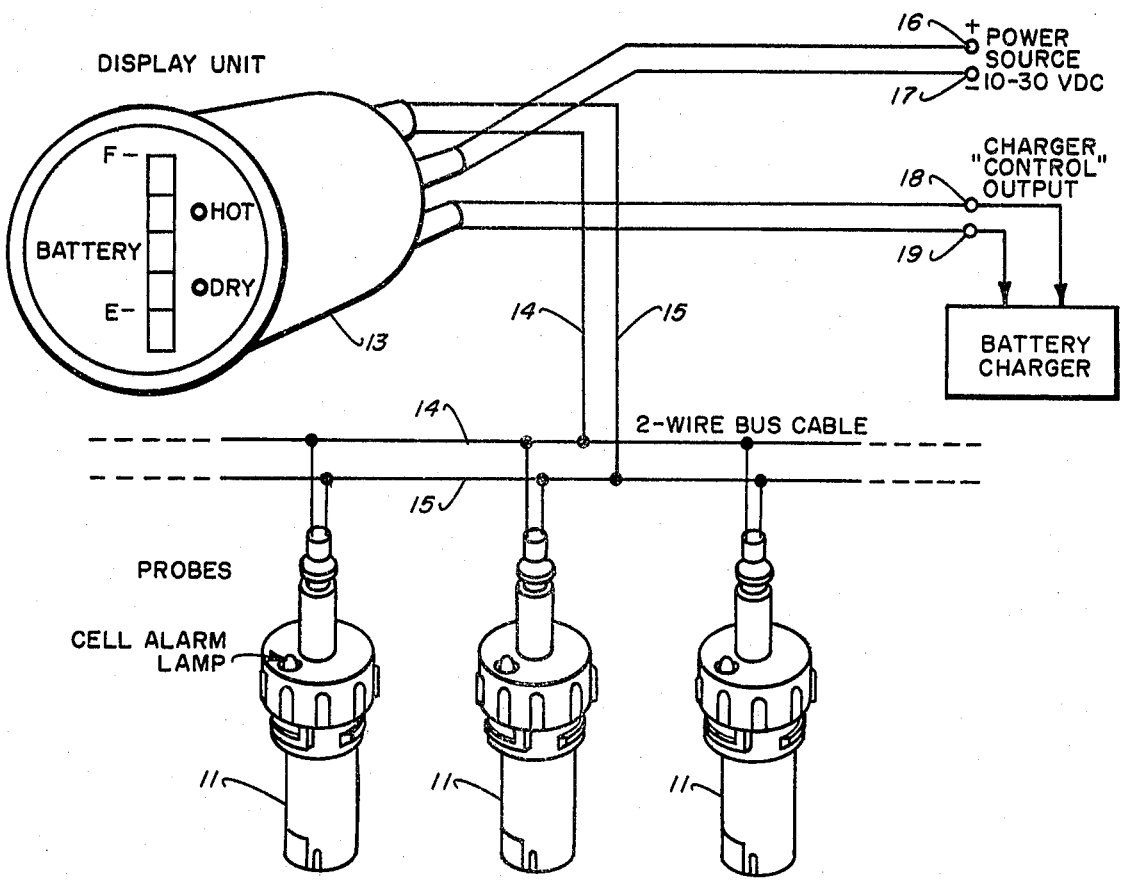
FIG. 1 shows a schematic diagram of a battery monitoring system of the invention.
Figure 2:
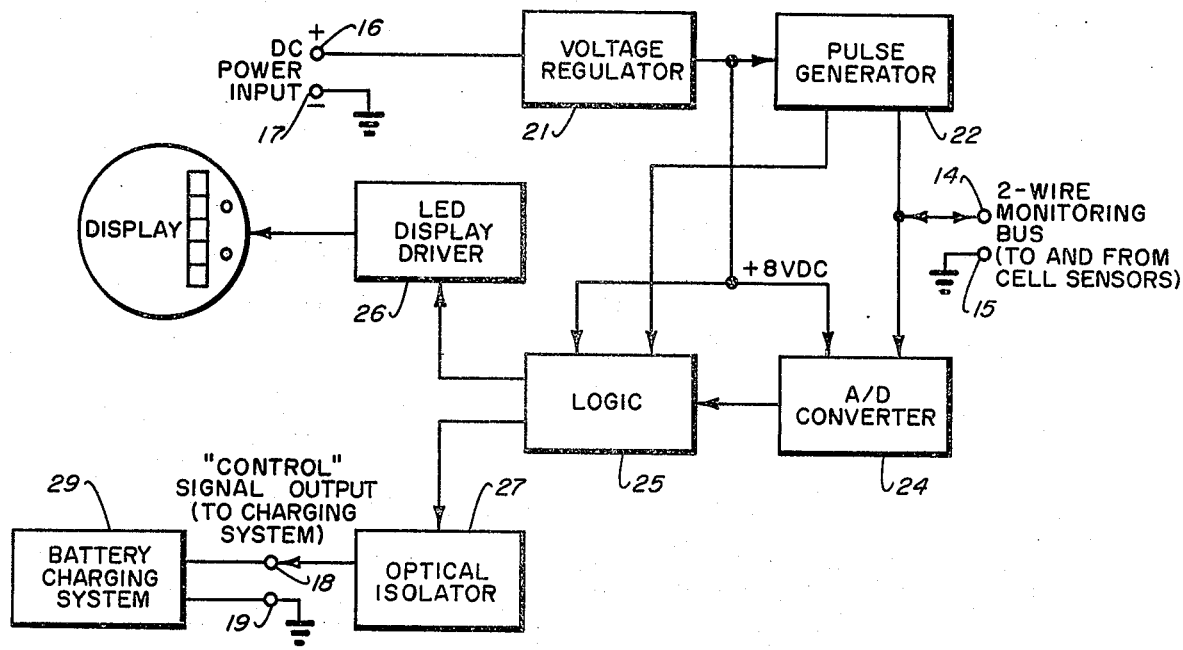
FIG. 2 is a block diagram of the elements comprising the display unit.

A diagram of the system is shown in FIG. 1 where a plurality of battery cell probes 11 are shown connected to a display unit 13. The probes 11 are each connected in parallel to a 2-wire bus cable 14 and 15 which in turn is connected to display unit 13. The display unit 13 operates from a source of DC power, connected at terminals 16 and 17, usually the monitored battery itself. The elements comprising the display unit 13 are shown in FIG. 2 and include: a voltage regulator which supplies power to the entire monitoring system, a pulse generator 22 which supplies and periodically interrupts power to the bus 14, 15, and circuits which sample the reply signal level on the bus and drive the display and the charger "control" output. The charger "control" output is provided by display unit 13 via terminals 18 and 19.

Figure 3:
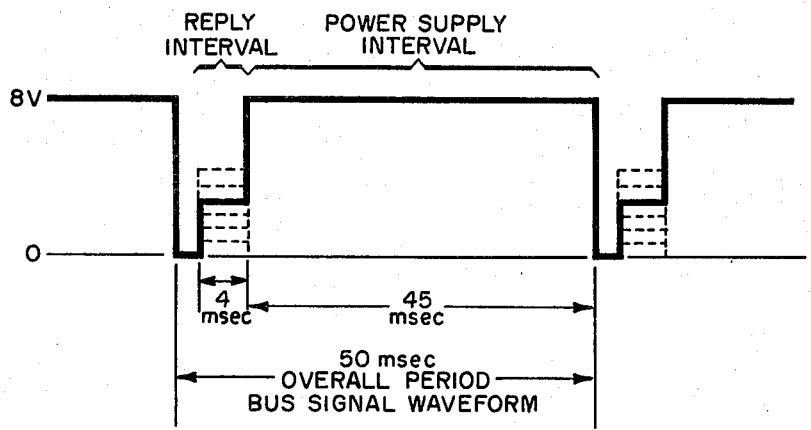
FIG. 3 shows the bus signal waveform.

The bus signal, as shown in FIG. 3, consists of a DC level 8 V for example, which is frequently interrupted by pulse generator 22 to permit the cell probe 11 sensors to reply. During the reply interval, as shown in FIG. 3, the display-unit pulse generator 22 is disconnected from the bus 14, 15, and the level is one of seven possible discrete levels as determined by the cell sensor units. The reply level is converted into logic levels by an A-to-D converter 24 and these are interpreted by integrated-circuit logic circuits 25 to drive the LED display 26 and the optical isolator 27 which provides the charger "control" signal for starting or terminating the charge system 29. Should a cell reach an out of specification condition, such as overheating during charging, or lack of electrolyte, the system will cause the charger 29 to shut off or reduce its output. For a system employing a bus power-signal of 8 volts, the expected reply levels are integer multiples of 1 volt, from zero to 6 volts, inclusive. These are interpreted by the A-to-D converter 24 and logic circuits 25 as indicated in Table 1.

TABLE 1

| Display Unit Response to Various Reply Levels | | | | | | | | | |
|---|---|---|---|---|---|---|---|---|---|
| INPUT | | OUTPUT | | | | | | | |
| Nominal Reply Level (volts) | A-to-D Converter Input Range (volts) | LED Display | | | | | | | Charger Control |
| | | Pilot | 1 | 2 | 3 | 4 | Hot | Dry | |
| 6.0 | 5.5 | ON | OFF | OFF | OFF | OFF | OFF | ON | OFF |
| 5.0 | 4.5–5.5 | ON | OFF | OFF | OFF | OFF | ON | OFF | OFF |
| 4.0 | 3.5–4.5 | ON | OFF | OFF | OFF | OFF | OFF | OFF | ON |
| 3.0 | 2.5–3.5 | ON | ON | OFF | OFF | OFF | OFF | OFF | ON |
| 2.0 | 1.5–2.5 | ON | ON | ON | OFF | OFF | OFF | OFF | ON |
| 1.0 | 0.5–1.5 | ON | ON | ON | ON | OFF | OFF | OFF | ON |
| 0.0 | 0.5 | ON | ON | ON | ON | ON | OFF | OFF | ON |

Figure 4:
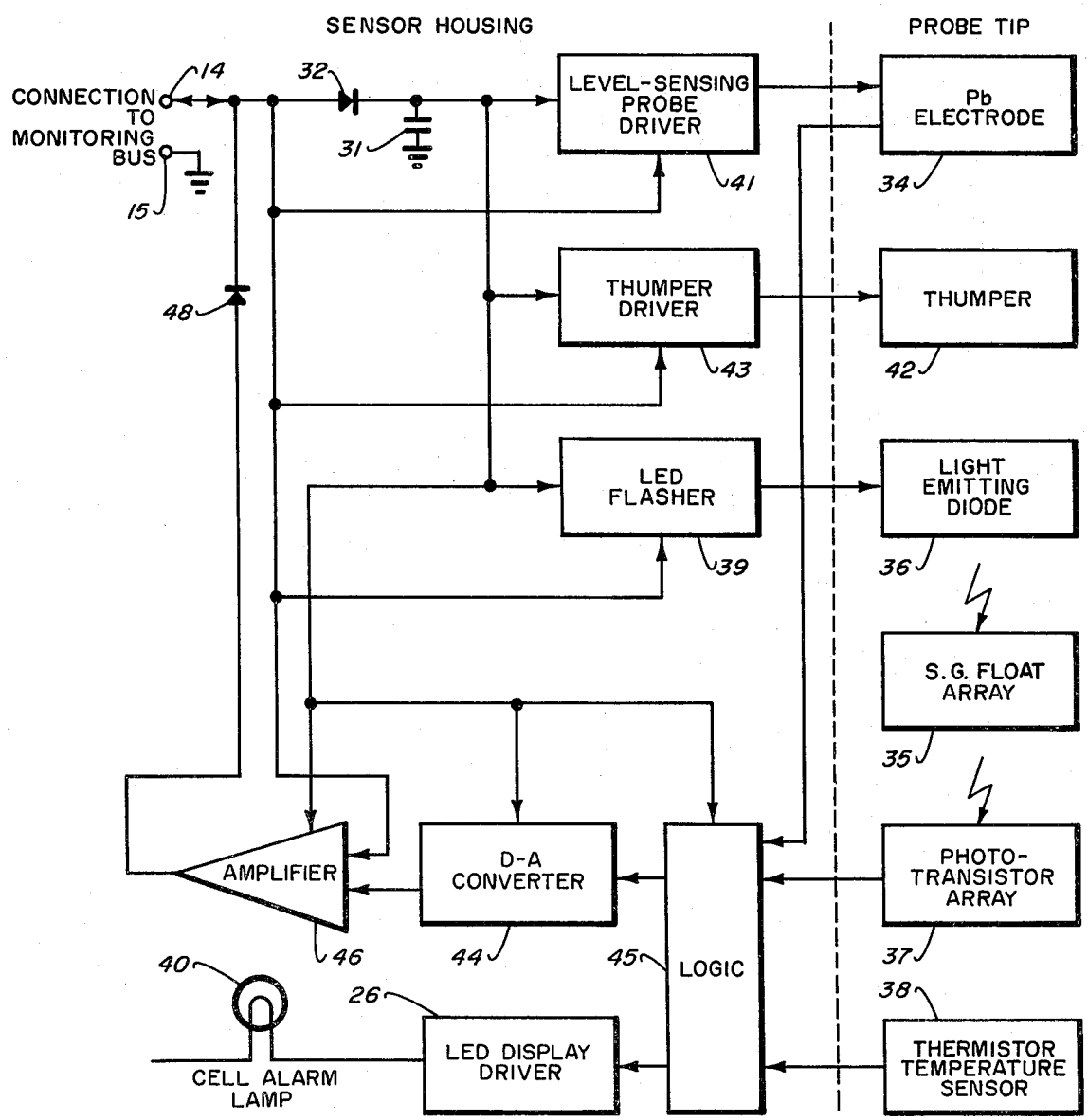
FIG. 4 is a block diagram of a cell sensor unit (i.e., probe).

The cell sensor unit (i.e., probe 11) consists of the elements shown in the block diagram of FIG. 4. The highest voltage present on the monitoring bus—the power supply level—is stored on a capacitor 31 for use during the reply interval; the first diode 32 prevents storage capacitor 31 from discharging back into the bus. When an interruption in the power input is sensed, the various sensors in the probe tip are activated to measure the cell condition, namely: electrolyte level, temperature, and specific gravity. In the tip of a probe 11 (FIG. 1), Pb electrode 34 is used to measure the electrolyte level. The specific gravity (S.G.) float array 35 together with light emitting diode 36 and photo-transistor array 37 measure the specific gravity. A thermistor 38 is used for detecting the temperature of a cell. These measurements are converted into a single voltage level (one of seven possible levels) and also into a logic level which controls a bad cell alarm LED indicator (e.g., cell alarm lamp 40) located on the top of the sensor. The bad cell alarm can indicate low electrolyte level, high temperature or low charge, showing an out of specification cell. This indicator permits the operator to identify the cell responsible for the bad cell alarm, since the display unit does not provide this information. A cell probe unit suitable for this purpose is disclosed in U.S. patent application Ser. No. 248,639 filed Mar. 27, 1981 for Specific Gravity Transducer and Battery Performance Indicator by Ernest A. Dahl and George Barry, now U.S. Pat. No. 4,329,406 issued May 11, 1982.

The cell probe 11 sensor determines an over-temperature condition by means of a thermistor-bridge-comparator scheme, for example, in temperature sensor 38. State of charge is inferred from the condition, floating or not, of a number of "specific gravity floats" in specific gravity float array 35. These are small wax floats which have differing densities and which are immersed in the electrolyte. The device is well described and illustrated in the aforementioned U.S. Pat. No. 4,329,406. The state of each float is determined optically by means of an LED light source 36 and a plurality of phototransistors in array 37. The LED 36 is pulsed by LED flasher 39 to minimize the power drain on the bus, however, light emitting diode 36 could simply be left on continuously at the expense of a somewhat larger voltage regulator in the display unit. Electrolyte level is sensed electrically by means of the lead (Pb) electrode 34 in direct contact with the acid. The acid is capacitively coupled to the sensing electronics (i.e., level-sensing probe driver 41) to prevent electrochemistry from altering its surface and to make the sensor 34 indifferent to the differing DC voltages which are present on various cells in the battery. In stationary battery systems it may be necessary to mechanically agitate the probe ocassionally to prevent the specific gravity floats from sticking in their channels; this is performed by a solenoid "thumper" 42 and driver 43 which taps the probe periodically.

In FIG. 4, information signals from Pb electrode 34, photo-transistor array 37 and thermistor temperature sensor 38 are fed to logic 45, and the to D/A convertor 44. Logic levels from logic circuit 45 are in turn fed to LED display driver 26. The signals from D/A convertor 44 are amplified by amplifier 46 and fed via bus 14, 15 to A/D convertor 24, logic circuit 25 and optical isolator 27 in display unit 13 to provide a "control" signal for the charging system 29 at terminals 18 and 19.

The battery monitoring system is indifferent to the number of cells which are connected across the bus 14, 15. The maximum number is set by the power handling capacity of the pulse generator 22 in the display unit. The pulse generator must be capable of supplying enough current to light the alarm lamps 40 on all of the dry cells. A typical vehicular system would handle 18 to 24 cells; a stationary battery can have many more.

The display unit 13 gives no indication of which of the monitored cells is responsible for the condition reported; the cell alarm lamps 40 on each of the probes 11 indicate the out of specification cells. The voltage level on the bus during the reply interval (see FIG. 3) is simply the highest level of voltage (as selected by diode 48 shown in FIG. 4 for each of the cell sensors) from any of the cell probe sensor units. The interpretation of the levels (Table 1) is arranged so that the worst condition is represented by the highest level, the next worst by the next highest level, and so on. Thus, a single (or many) dry cells with override all indications from the remaining cells. If none are dry, then a single (or many) overheated cells will show, to the exclusion of any state-of-charge (specific gravity) information. If no cells are dry or hot, then the specific gravity displayed will be that of the most nearly discharged cell. This invention automatically scans all the cells in a system and provides automatic telemetering to a remote readout to provide data on all cells, but provide readout on the worst cell.

This system provides cell controlled charging system which permits constant current or pulse charging of battery cells resulting in faster charging and simultaneously providing control so that possible damage to cells is reduced, and since overcharging is restricted providing longer cell life.

Obviously many modifications and variations of the present invention are possible in the light of the above teachings. It is therefore to be understood that within the scope of the appended claims the invention may be practiced otherwise than as specifically described.

What is claimed is:

1. A battery cell controlled automatic battery charging system which allows faster charging while simultaneously restricting overcharging to reduce cell damage, comprising:

a. a battery charging means operable to charge a bank of batteries;

b. a plurality of battery cell probes equal in number to the number of cells in the bank of batteries, one cell probe being provided for each battery cell, respectively;

c. a display means including electrical circuitry connected to said battery charging means;

d. each said battery cell probe being connected to said display means; and, each said battery cell probe being operable to sense and monitor the condition of its respective battery cell and indicate by electrical signals to said display means whenever a cell is out of specification by being any of low in charge, overheated, and low in electrolyte;

e. a cell alarm means provided on each said battery cell probe to indicate to an operator each of said battery cells that is out of specification;

f. said display means and electrical circuitry being operable to visually display the condition of the most out of specification battery cell in the bank of batteries and also to provide a control signal to said battery charging means to cause said battery charging means to charge said bank of batteries whenever one of said probes indicates that a cell has a low charge; said display means and electrical circuitry operable to cause said battery charging means to stop charging whenever a battery cell becomes overheated or low in electrolyte, whereby faster charging is allowed with reduced possibility of over charging and cell damage.

2. A system as in claim 1 wherein a power supply for said display means is provided from said bank of batteries.

3. A system as in claim 1 wherein said cell alarm means is an individual lamp means on each battery cell probe.

4. A system as in claim 1 wherein said battery cell probes are electrically connected to said display means via a two-wire bus.

5. A system as in claim 4 wherein said display means electrical circuitry comprises:
a. a power supply and a voltage regulator for supplying power to the system;
b. a pulse generator for supplying and periodically interrupting power to said two-wire bus to permit reply signals from said battery cell probes to indicate battery cell specifications;
c. circuitry for sampling the reply signal levels on said two-wire bus from said battery cell probes and converting the reply signal levels into logic levels which in turn provide control signals to said battery charging means.

6. A system as in claim 5 wherein the periodic interruption of power by said pulse generator is sensed by circuitry in said battery cell probes and various sensors in the tip of each said battery cell probe are activated during the periods of interruption to measure each cell condition, respectively, as to electrolyte level, temperature and specific gravity; said measurements of cell condition being converted by said battery cell probe circuitry into signals which via said display means circuitry control said battery charging means and signals which control a cell alarm means on each respective battery cell probe.

* * * * *